(12) United States Patent
Lanio

(10) Patent No.: US 8,158,954 B2
(45) Date of Patent: Apr. 17, 2012

(54) MULTI-AXIS LENS, BEAM SYSTEM MAKING USE OF THE COMPOUND LENS, AND METHOD OF MANUFACTURING THE COMPOUND LENS

(75) Inventor: Stefan Lanio, Erding (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 181 days.

(21) Appl. No.: 12/492,610

(22) Filed: Jun. 26, 2009

(65) Prior Publication Data

US 2009/0261266 A1 Oct. 22, 2009

Related U.S. Application Data

(62) Division of application No. 10/540,178, filed on Dec. 5, 2005, now Pat. No. 7,576,917.

(30) Foreign Application Priority Data

Dec. 17, 2002 (EP) .................................... 02028346

(51) Int. Cl.
*H01J 37/141* (2006.01)
(52) U.S. Cl. ................ 250/396 ML; 250/310; 335/210
(58) Field of Classification Search .................. 250/310; 335/210, 213
See application file for complete search history.

(56) References Cited

U.S. PATENT DOCUMENTS

| | | | | |
|---|---|---|---|---|
| 2,259,531 A * | 10/1941 | Miller et al. | | 335/211 |
| 3,417,224 A | 12/1968 | Steigerwald et al. | | |
| 3,715,580 A * | 2/1973 | Maekawa et al. | | 250/397 |
| 4,209,702 A * | 6/1980 | Shirai et al. | | 250/396 ML |
| 6,633,366 B2 * | 10/2003 | de Jager et al. | | 355/67 |
| 7,576,917 B2 | 8/2009 | Lanio | | |
| 2001/0028038 A1 | 10/2001 | Hamaguchi et al. | | |
| 2004/0105160 A1 | 6/2004 | Kienzle et al. | | |
| 2006/0169910 A1 * | 8/2006 | Frosien et al. | | 250/396 ML |

FOREIGN PATENT DOCUMENTS

| | | |
|---|---|---|
| DE | 3010814 A1 | 9/1981 |
| JP | 5423476 | 2/1979 |
| JP | 2000182558 A | 6/2000 |
| WO | WO-98/13854 | 4/1998 |
| WO | WO-01/75946 A1 | 10/2001 |

OTHER PUBLICATIONS

A.A. Mikhailichenco, "Some Features of Superconducting Dual Bore Lense," IEEE Proceedings of the 1999 Particle Accelerator Conference, New York 1999 pp. 3218-3220.

J. Frosien et al., "Compound magnetic and electrostatic lenses for low-voltage applications," Journal of Vacuum Science & Technology B, Nov./Dec.1989 vol. 7(6): pp. 1874-1877.

Translation of Japanese Office Action dated Sep. 24, 2008.

Extended European Search Report dated Aug. 3, 2009 for Application No. 08156483.3.

* cited by examiner

*Primary Examiner* — Jack Berman

(74) *Attorney, Agent, or Firm* — Patterson & Sheridan, LLP

(57) ABSTRACT

The invention provides a lens system for a plurality of charged particle beams. The lens system comprises an excitation coil providing a magnetic flux to a pole piece unit having a first pole piece, a second pole piece and at least two openings for charged particle beams, wherein the two openings are arranged in one row, thereby forming a lens row, and wherein the pole piece unit has an elongated shape.

20 Claims, 12 Drawing Sheets

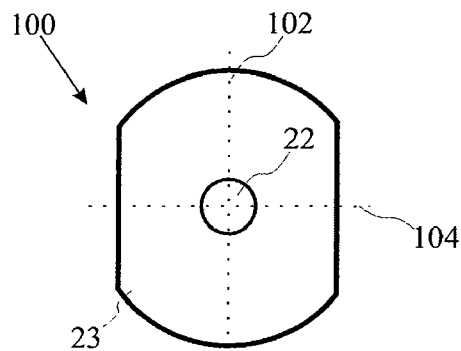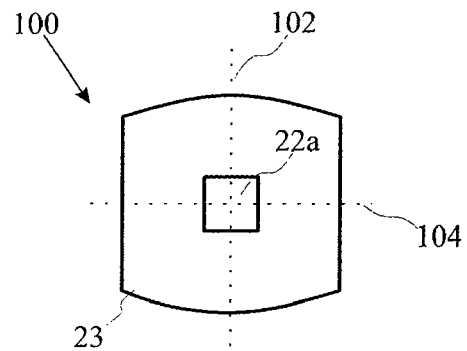
Fig. 10a                Fig. 10b
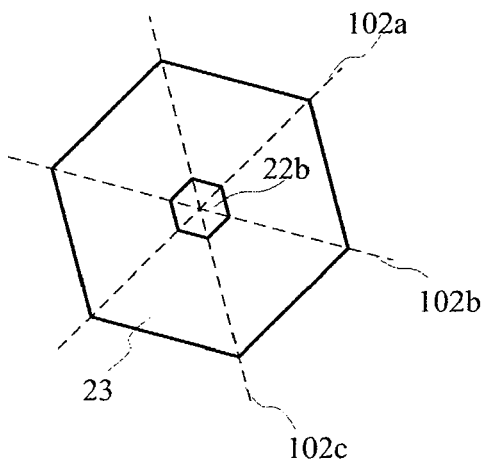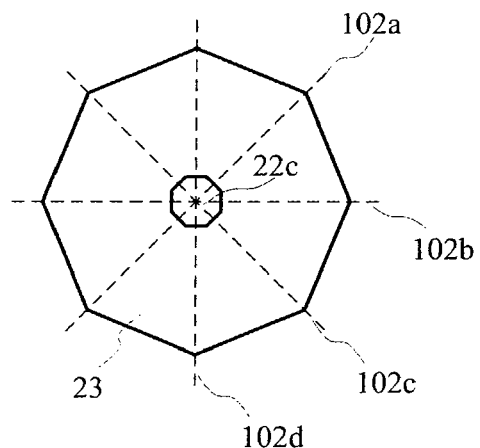
Fig. 11a                Fig. 11b

MULTI-AXIS LENS, BEAM SYSTEM MAKING USE OF THE COMPOUND LENS, AND METHOD OF MANUFACTURING THE COMPOUND LENS

CROSS-REFERENCE TO RELATED APPLICATIONS

This application is a divisional application of U.S. patent application Ser. No. 10/540,178, entitled "MULTI-AXIS LENS, BEAM SYSTEM MAKING USE OF THE COMPOUND LENS, AND METHOD OF MANUFACTURING THE COMPOUND LENS", filed Dec. 5, 2005, now U.S. Pat. No. 7,576,917 which is incorporated herein by reference.

FIELD OF THE INVENTION

The invention relates to an optical system for multiple beam charged particle applications, such as inspection system applications, testing system applications, lithography system applications and the like. It also relates to a lens system for a plurality of charged particle beams and to methods of manufacturing thereof. In particular, the invention relates to a lens system for a plurality of charged particle beams comprising modules, more particularly to a lens system for multi-beam applications. Specifically, it relates to a lens system for a plurality of charged particle beams, a method of manufacturing a lens system and a charged particle beam device.

BACKGROUND OF THE INVENTION

Charged particle beam apparatuses are used in a plurality of industrial fields. Testing of semiconductor devices during manufacturing, exposure systems for lithography, detecting devices and inspection systems are only some of these fields.

In general, there is a high demand for structuring and inspecting specimens within the micrometer or nanometer scale. On such a small scale, process control, inspection or structuring is often done with charged particle beams, e.g. electron beams, which are generated and focused in charged particle beam devices, such as electron microscopes, electron beam pattern generators or charged particle inspection systems. Charged particle beams offer superior spatial resolution compared to, e.g. photon beams due to their short wavelengths.

However, for a given beam diameter, the charged particle beam current limits the throughput of charged particle beam systems. Since further miniaturization of, e.g. structures to be imaged is necessary, the charged particle beam diameter has to be decreased. As a result, the beam current for individual beams and thus, the throughput has to be decreased.

In order to increase the total charged particle beam current and thus, the throughput, a plurality of charged particle beams can be used. One option for a system applying a plurality of charged particle beams is to combine several single beam columns with each other. However, some of the components, especially magnetic lenses, cannot be miniaturized sufficiently, since the magnetic field cannot be arbitrarily increased. Thus, the columns have to be spaced such that the electron beams have a distance of 100 mm to 200 mm.

To overcome this problem, U.S. Pat. No. 3,715,580 utilizes a magnetic lens with a circular excitation coil providing two holes, each for one electron beam. Thereby, the continuous rotation symmetry of previous lenses is abandoned since the hole (optical axis) for each electron beam has different distances from the position of the excitation.

Patent application US 2001/0028038A1 shows an excitation coil common to a plurality of holes in a pole piece. To increase the number of electron beams that can be used, US 2001/0028038A1 uses a two-dimensional array. To compensate for the differences with respect to the focusing properties of individual beams, this prior art teaches to use lens intensity adjusters.

Since there is a strong requirement for improving resolution, for simplifying manufacturing and for minimizing aberrations in such systems, it is an object of the present invention to further improve state of the art devices.

SUMMARY OF THE INVENTION

The present invention intends to provide an improved lens system for a plurality of charged particles. Thereby, one object is to improve the symmetry of the lens field used for imaging the charged particle beam. Another object is to provide an advantageous manufacturing method for the lens systems.

In one embodiment, the present invention provides a lens system for a plurality of charged particle beams, the lens system comprising a lens system for a plurality of charged particle beams, comprising at least two lens modules, each comprising a first pole piece, a second pole piece and at least one opening for a charged particle beam, and at least one excitation coil providing a magnetic flux to the at least two lens modules, wherein each lens module constitutes a component.

In one embodiment, the present invention also provides a lens system for a plurality of charged particle beams comprising an excitation coil providing a magnetic flux to a pole piece unit having a first pole piece, a second pole piece and at least two openings for charged particle beams, wherein the openings are arranged in one row, thereby forming a lens row and wherein the pole piece unit has an elongated shape.

In one another embodiment, the present invention provides a method for manufacturing a lens system comprising manufacturing a plurality of lens modules, each comprising a first pole piece, a second pole piece and at least one opening for a charged particle beam, and providing a common excitation coil for at least two lens modules.

In one embodiment, the present invention provides a multiple charged particle beam device comprising a charged particle beam source, a detector for detecting secondary particles, beam shaping means, a housing for the charged particle beam column, wherein the housing can be evacuated, at least one lens system comprising at least two lens modules, each comprising a first pole piece, a second pole piece and at least one opening for a charged particle beam, and at least one excitation coil providing a magnetic flux to the at least two lens modules, wherein each lens module constitutes a component.

In one embodiment, the present invention provides a multiple charged particle beam device, comprising a charged particle beam source, a detector for detecting secondary particles, a beam shaping means, a housing for the charged particle beam column, whereby the housing can be evacuated, and at least one lens system for a plurality of charged particle beams, the at least one lens system comprising an excitation coil providing a magnetic flux to a pole piece unit having a first pole piece, a second pole piece and at least two openings for charged particle beams, wherein the two openings are arranged in one row, thereby forming a lens row, and wherein the pole piece unit has an elongated shape.

Further advantages, features, aspects and details of the invention are evident from the dependent claims, the description and the accompanying drawings.

According to one aspect of the present invention, a lens system for a charged particle column is provided. The lens system comprises at least two lens modules. The at least two lens modules share a single common excitation coil. Each lens module comprises a first and second pole piece and an opening for a charged particle beam.

Making use of the at least two lens modules with a common excitation coil, the size of the work pieces of the magnetic-conductive material can be reduced. Thus, the required size of raw material, which is difficult to obtain in large pieces, is reduced. Further, demands on manufacturing tolerances can more easily be realized with smaller work pieces attained from the raw material. Additionally, the lens properties of the individual lenses are more uniform with respect to each other.

According to a preferred aspect, a magnetic lens field, provided for each optical axis, has an n-fold symmetry with $1<n<\infty$. Preferably, a 2-fold symmetry with respect to the optical axis is realized.

Alternatively, the symmetry can be described as having two planes of symmetry, or as having no dipole moment.

Thus, a magnetic lens system for a plurality of charged particle beams is provided. The lens system has an n-fold symmetry with $1<n<\infty$ with respect to each optical axis. Prior art systems only provide a similar symmetry with respect to the entire lens for a plurality of beams. Thus, the lens system according to an aspect of the invention does not have a weak continuous rotational symmetry, but a strong n-fold symmetry instead. In this context, weak or strong symmetry should be understood as follows. Generally, lens systems intend to provide a lens field with a defined symmetry. This symmetry is more or less distorted by manufacturing tolerances or by limitations to the lens design. A weak symmetry is to be understood as a rough approximation of the desired symmetry. Thus, the weak symmetry has a lot of distortion, since, e.g. openings for a charged particle beam are not concentric with a circular excitation coil. A strong symmetry is to be understood as close approximation of the desired symmetry. Thus, a strong symmetry has only little distortion due to manufacturing imperfections or the like. The well-defined non-continuous rotational symmetry according to an aspect of the invention can more easily be corrected, since the symmetry of the field influencing the charged particle beam is known.

According to a further preferred aspect, the lens modules are arranged such that the openings form a linear lens array. It is especially preferred when at least four openings in one row are provided, thereby increasing symmetry for each opening with respect to its optical axis. In one example, two openings are arranged in one row, thereby forming a lens row. In this context, a lens row is referred to as several openings for charged particle beams positioned to form substantially a line. By increasing the number of openings within one row, a quasi-infinitely long row of openings is formed. In this context, a quasi-infinitely long linear lens array is a row of lens openings with a length such that most of the openings are influenced by magnetic fields of the surrounding as if the linear lens array is infinitely long. Thus, the necessity to avoid cross talk between individual lens modules is reduced, since for a quasi-infinitely long linear lens array, each opening has a similar influencing periphery.

Providing the lens modules such that a linear lens array is formed, it is further preferred when the excitation coil is non-circular, and more preferably if it is rectangular with rounded edges. As described above, the lens module is shaped to provide a magnetic field with an n-fold symmetry. Furthermore, the excitation coil, as well as the opening for the charged particle beam influences the symmetry of the magnetic lens filed. If, according to the described preferred aspect, the excitation coil is formed non-circular, the intended symmetry can be similarly applied to the excitation coil. Therefore the desired symmetry for the entire system can be obtained more easily. Generally, an excitation coil has several windings. Having a rectangular coil with rounded edges a stadium-like form is realized, especially if the edges are rounded, such that at two ends a semi-circle is realized.

According to another preferred aspect, the lens modules are positioned such that adjacent optical axes have a distance between 10 mm to 90 mm, preferably between 30 mm to 65 mm. Thus, a distance between charged particle beams can be achieved which is smaller than a distance between charged particle beams in the case when two individual charged particle beam columns are located next to each other. Consequently, inspection, lithography or testing applications for a plurality of charged particle beams with an increased density of charged particle beams can be realized.

According to a further preferred aspect, adjacent lens modules are provided with a gap of about 0.1 mm to 3 mm. More preferably, the gap is filled with a non-magnetic material. Thus, a separation of the individual lens modules can be realized and thus cross talk can be avoided or significantly reduced. As a result, other lens modules do not distort the symmetry of the individual lens modules.

According to another aspect of the present invention, the lens module is manufactured according to a method comprising the following steps: manufacturing a plurality of lens modules, and providing a common excitation coil for at least two lens modules. Thus, the size of magnetic-material work pieces that have to be processed is reduced. Making use of this aspect, it is preferred when a cylindrical intermediate work piece is formed. Thus, processing is further simplified and manufacturing tolerances can be further decreased.

According to another aspect of the present invention, a lens system for a plurality of charged particle beams is provided. The lens system comprises a pole piece unit with first pole piece, a second pole piece and at least four openings for charged particle beams and an excitation coil. Thereby, the openings are arranged in one row, forming a lens row. The charged particle beam travels through each of the openings, thereby being focused in the lens field area. According to one aspect, the lens system comprises at least seven openings in one row. In one aspect, the lens system comprises at least four openings in one row. Thus, the symmetry of the magnetic lens field with respect to each individual opening is approximately equal to the symmetry of an infinitely long lens row. Consequently, at least two planes of symmetry can be obtained.

According to a preferred aspect, the excitation coil has a rectangular shape with rounded edges. Thus, the symmetry of the excitation coil corresponds to the desired symmetry of the magnetic lens field.

According to a preferred aspect, a lens system is provided comprising at least two lens rows each comprising an excitation coil. The lens rows are arranged next to each other to form a two-dimensional arrangement of openings. Thus, the number of charged particle beams and the throughput of the measuring system can be increased.

The invention is also directed to apparatus for carrying out the disclosed methods including apparatus parts for performing each described method steps. These method steps may be performed by way of hardware components, a computer programmed by appropriate software, by any combination of the two or in any other manner. Furthermore, the invention is also directed to methods by which the described apparatus operates or is manufactured. It includes method steps for carrying out every function of the apparatus.

BRIEF DESCRIPTION OF THE DRAWINGS

Some of the above indicated and other more detailed aspects of the invention will be described in the following description and partially illustrated with reference to the figures, wherein:

FIGS. 10a to 11b show schematic top views of embodiments according to the invention having different types of symmetry;

DETAILED DESCRIPTION OF THE DRAWINGS

Without limiting the scope of protection of the present application, in the following the charged particle multi-beam device will exemplarily be referred to as an electron multi-beam device. Thereby, electron beam device with a plurality of electron beams might especially be an electron beam inspection system. The present invention can still be applied for apparatuses using other sources of charged particles for inspection, testing and lithography applications, and in the case of detection devices other secondary charged particles to obtain a specimen image or the like.

Figure 18:
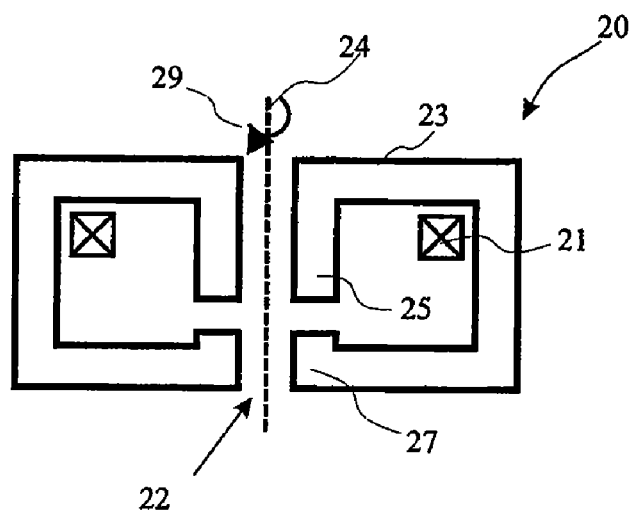
FIGS. 18 to 19 show schematic views of a circular magnetic lens for a single charged particle beam.

In the following, a state of the art optic for focusing a plurality of electron beams will be described with reference to FIGS. 18-19. A magnetic lens 20 is rotationally symmetrical with respect to optical axis 24. This rotational symmetry is indicated with arrow 29 in FIG. 18. The magnetic lens consists of an excitation coil 21 and a magnetic-conductive circuit 23 which confines the magnetic field to the gap region between upper pole piece 25 and lower pole piece 27. According to different shapes of lens systems, other pole pieces arrangements can be realized. Radial gap lenses, for example, have an inner and an outer pole piece. Therefore, generally speaking, a lens system comprises a first and a second pole piece, forming a gap region to confine the magnetic field. The field in the gap region interacts with an electron beam traveling through opening 22. In the case of a perfect rotationally symmetrical lens and an electron beam traveling on the optical axis 24 (=axis of symmetry), the electron beam will be influenced by the field without introducing astigmatism.

Figure 19:
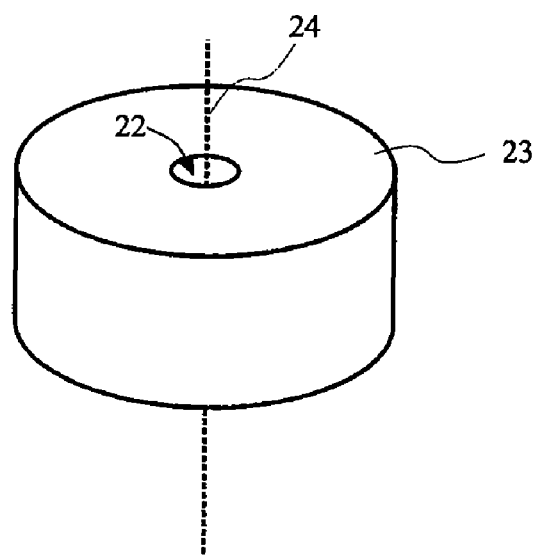

FIG. 19 shows a 3-dimensional view of a rotationally symmetrical magnetic lens. The magnetic-conductive circuit 23 forms the body of the lens. An electron beam travels through opening 22. Thereby, the magnetic field focuses the electron beam. Due to the symmetry, aberrations are minimized if the beam travels on the optical axis 24.

Figure 20:
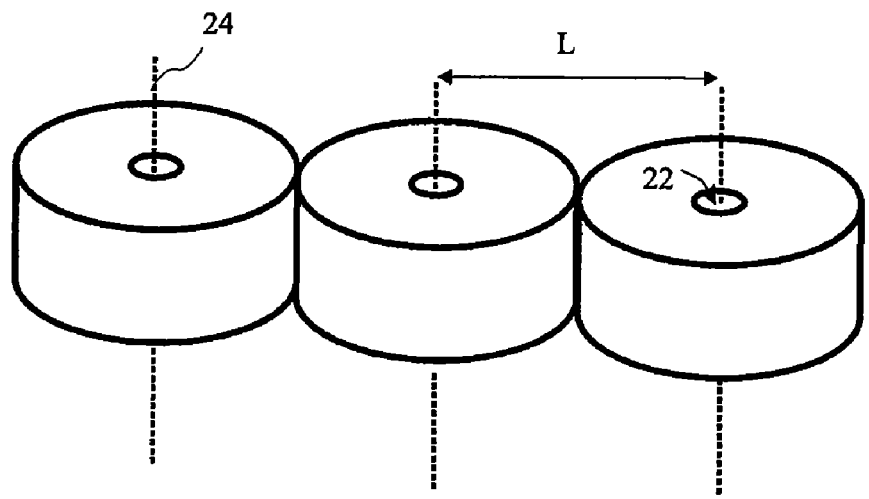
FIGS. 20 and 21 show schematic views of possibilities to build a lens system for a plurality of charged particle beams.

FIG. 20 shows several circular lenses located next to each other. The distance between two optical axes 24 is denoted as L. The only possibility to further decrease the distance between two neighboring electron beams is to decrease the size of the lens. This however, would result in a reduction of the field strength and thus the imaging properties of the lenses.

Figure 21:
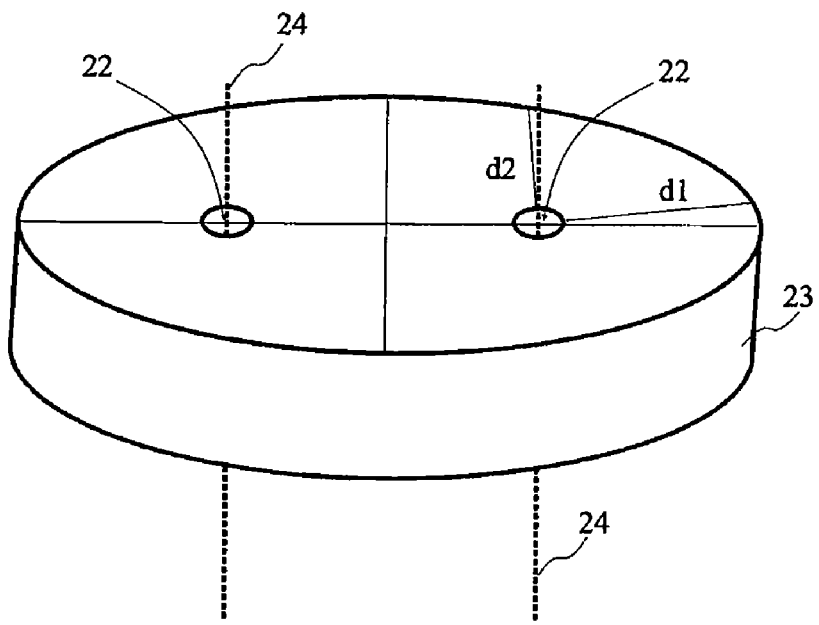

FIG. 21 shows a further attempt to provide a lens for two electron beams. One circular magnetic circuit 23 is provided with two openings forming a gap region wherein the magnetic field interacts with the electron beam. A problem of such a system can be understood when referring to the different distances d1 and d2. The distances d1 and d2 indicate two arbitrary distances which are measured along a direction radial to optical axis 24. As can be seen, the edge of the magnetic-conductive circuit body has different distances to the optical axis. The magnetic-conductive circuit 23 of the lens consists of permalloy or µ-metal or any other magnetic conductive material. The smaller the magnetic resistance of the material is, the less influences will be introduced by the distance of the excitation of the magnetic circuit and the field-beam-interaction region. Because of the non-zero magnetic resistance of the magnetic-conductive material of the pole piece unit 23, the magnetic field around openings 22 shows a gradient. Thus, the magnetic fields influencing each electron beam is not rotational symmetric with respect to each individual optical axis.

To minimize this effect, the magnetic lens circuit can be enlarged, thereby obtaining smaller relative differences with respect to the magnetic resistances. Thus, the amount of distortion of the symmetry can be reduced by enlarging the pole piece area between the location of excitation an the location in which the magnetic field acts on the electron beam. However, such an approach is in conflict with manufacturing aspects. For example, the availability of magnetic materials can be limited for large pieces. Further, as shown in FIG. 21 the lens system is not continuously rotationally symmetrical, as compared to an embodiment of FIG. 19. Therefore, the lens system can not be manufactured with a lathe or the like. Thus, the low tolerance manufacturing of an embodiment according to FIG. 21 is more delicate.

The present invention intends to provide a more sophisticated manufacturing method and apparatus. Thereby, several options can be realized. As can be seen, there is a desire to realize multi-electron lenses. Further, the distance between the optical axes of the electron beams should be decreased. However, the attempt according to FIG. 21 reduces the continuous rotational symmetry with respect to each individual optical axis without increasing a different type of symmetry, such as n-fold rotational symmetries or symmetries with respect to a plurality of planes. In general, due to the asymmetry introduced, astigmatism is increased.

The present invention provides a lens that gives up a weak continuous rotational symmetry in favor of a strong n-fold symmetry, whereby n is at least two. Thus, there is no attempt to obtain a continuous rotational symmetry. Instead, a lens system is provided which has a magnetic field for each electron beam that is theoretically free of a dipole moment. In this context, weak or strong symmetry should be understood as follows. Generally, lens systems intend to provide a lens field with a defined symmetry. This symmetry is more or less distorted by manufacturing tolerances or by limitations to the lens design. A weak symmetry is to be understood as a rough approximation of the desired symmetry. Thus, the weak symmetry has a lot of distortion, since, e.g. openings for a charged particle beam are not concentric with a circular excitation coil. A strong symmetry is to be understood as close approximation of the desired symmetry. Thus, a strong symmetry has only little distortion due to manufacturing imperfections or the like.

Thereby, it is possible to work with lens modules, that is to say a lens consisting of several magnetic-conductive pieces. Thus, the size of the required magnetic raw material is reduced. Further, manufacturing processes can be improved.

Figure 1A:
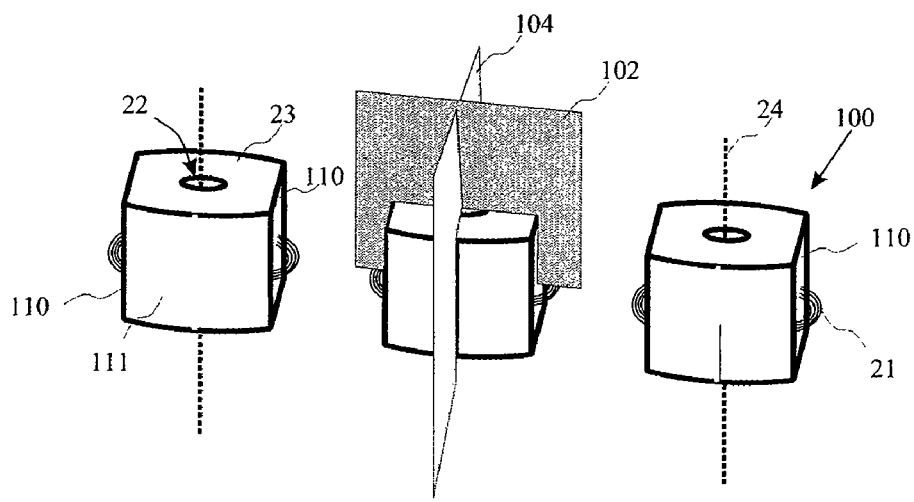
FIGS. 1a to 1c show schematic views of the build-up of an embodiment of a lens system according to the invention.
Figure 1B:
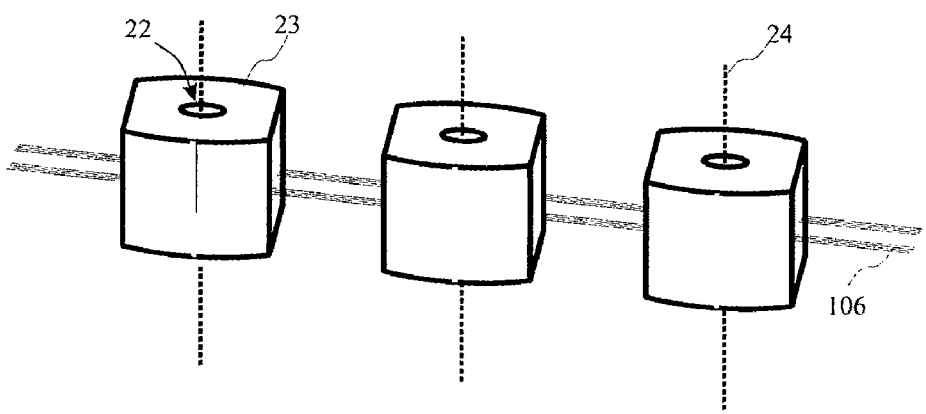

One embodiment according to the present invention will now be described with respect to FIGS. 1a to 1c. FIG. 1a shows three lens modules 100. The lens module has cylinder-like form comprising two convex sides 111 and two flat sides 110. The two opposite sides 110 form two parallel flats. Sides 110 are not entirely closed, but have a part not covered by an external wall. Therefore, excitation coil 21 can protrude out of the magnetic-conductive circuit 23 in FIG. 1a. The lens module has two planes of symmetry 102 and 104, intersecting on optical axis 24. Opening 22 is concentric to optical axis 24. Thus, excited by the coil, each lens module 100 has a magnetic lens field, which is symmetrical to plane 102 and 104. The symmetry can also be described as a 2-fold symmetry with respect to the optical axis 24. In one aspect, the center of each opening provides an optical axis so that a lens field corresponding to each opening has substantially at least two planes of symmetry with respect to its optical axis. What could further be described as forming a lens module such that the magnetic lens field has no dipole moment and a defined quadrupole moment.

To bring the electron beams of an electron device closer together, the lens modules 100 can be located side by side. Additionally, the circular coils 21 are replaced by a common excitation device 106 with straight conductors. The symmetry of each optical axis or opening 22 is not affected by this modification of the excitation introduced in FIG. 1b compared to FIG. 1a.

Figure 1C:
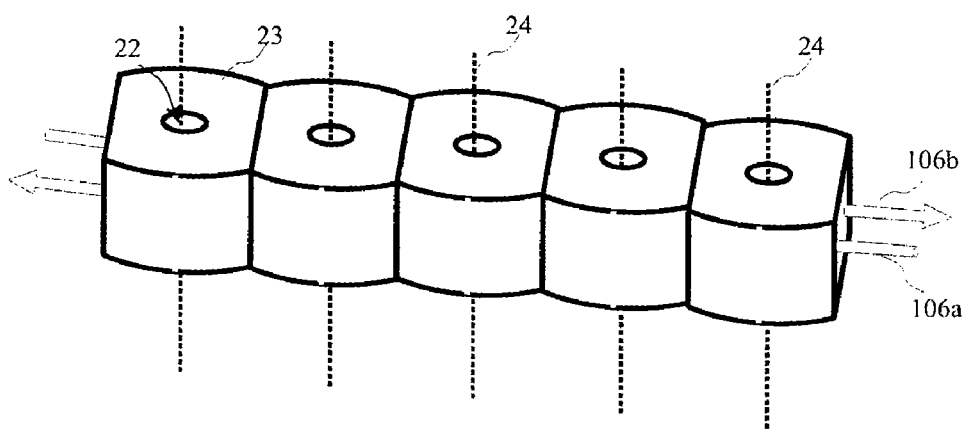

FIG. 1c shows five lens modules 100 located directly side by side. The electrical flux inducing the magnetic fields is indicated as 106a and 106b. Having the electrical current continued to each side, every lens module 100 of FIG. 1c influences an electron beam on its optical axis 24 according to the same excitation (cross talk and screening disregarded) and with the same dipole-less symmetry, already described above.

The distance of the five optical axes 24 in FIG. 1c could be significantly reduced. This distance is in the range of 40 mm instead of about 100 mm (see "L" in FIG. 20)

According to a preferred manufacturing process, the embodiment shown in FIGS. 1 a to 1c is manufactured from circular magnetic-conductive circuits having circular openings which are flattened at two opposite sides to obtain two parallel flats. The modules (lens modules 100) are located side by side, putting the flattened sides close together. Thus, most of the manufacturing steps can be conducted with small rotationally symmetrical work pieces. Thus, the precision required for good imaging properties can be achieved easier, since a lathe or the like can be used for manufacturing most of the modules.

Figure 2:
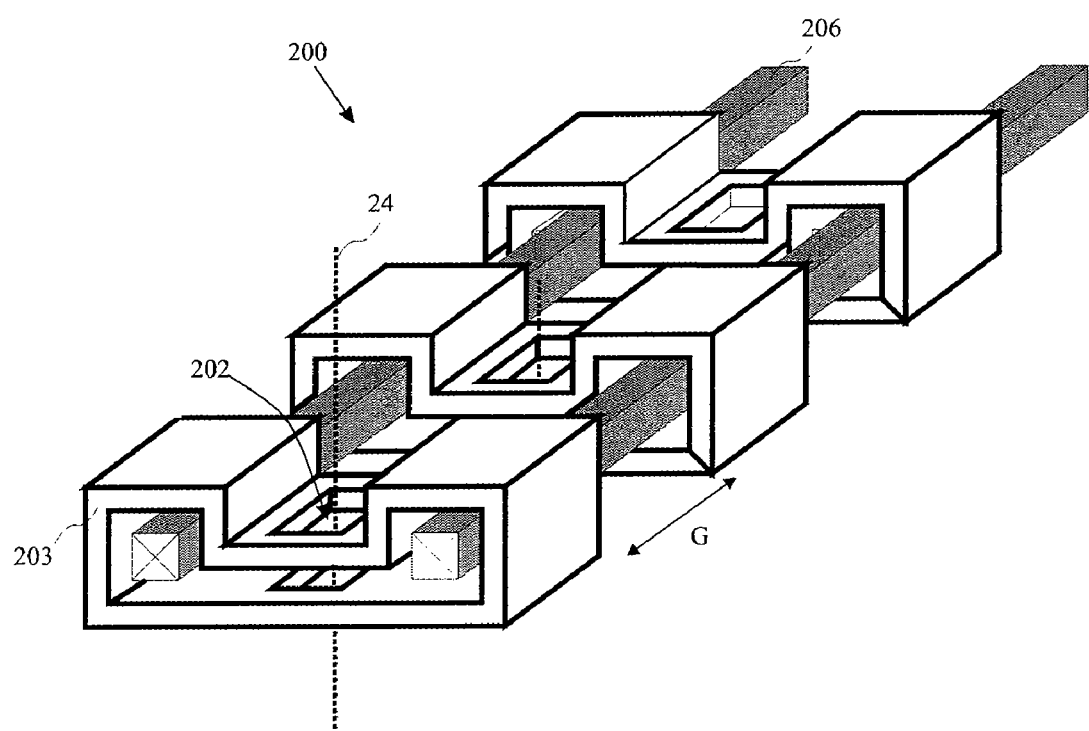
FIG. 2 shows a schematic view of a further embodiment of a lens system according to the invention.

Another embodiment according to the invention is shown in FIG. 2. Lens modules 200 are not manufactured from a circular work piece but from a rectangular work piece. Also opening 202 penetrating the magnetic-conductive circuit 203 has an rectangular shape. Opening 202 comprises a hole in the upper and in the lower pole piece of the magnetic-conductive circuit. Two conductors 206 in the form of straight wires are used to excite the lens modules and thereby generate a lens field. The lens field has, similar to FIGS. 1a to 1c, a 2-fold symmetry with respect to the optical axis. Further, each module and the lens field, respectively, have two planes of symmetry, which intersect the optical axis 24. In other words, there is no dipole moment.

In FIG. 2, the lens modules 200 are spaced by distance G. G can for example be between 0.1 to 3 mm. Within FIG. 2, distance G is for graphical reasons drawn to be larger. Distance G has the following effect. Conductive material circuit 203 has a low magnetic resistance. Air (or any non-magnetic material) in the gap between the lens modules 200 has a high magnetic resistance. Thus, each lens module can be considered as having no neighboring lens module. Due to the high magnetic resistance within the gap (distance G), cross talk can be avoided or significantly decreased.

Further embodiments of the present invention will next be described with respect to FIGS. 3 to 5. Therein, the magnetic-conductive circuits 301, shown in FIG. 2, are used as lens modules without any space in-between. Thus, there might be cross talk to the neighboring lens module 301. However, a lens module, e.g. module 301c, is influenced by adjacent modules 301b and 301d. Influences by modules 301a and 301e and, especially, even further distant modules can be neglected. Thus, as long as the linear lens array 300 is long enough, most of the lens modules 301 are influenced by the same number of neighboring modules. For this reason, the symmetry arguments provided above, remain valid.

However, lens modules 301 positioned at the end of lens array 300 do not have a symmetrical periphery. Thus, lens modules positioned at the end of the lens array should either not be used for focusing an electron beam or the effect of not having a neighboring lens module should be compensated for. This will be explained below with respect to FIG. 7.

Figure 3:
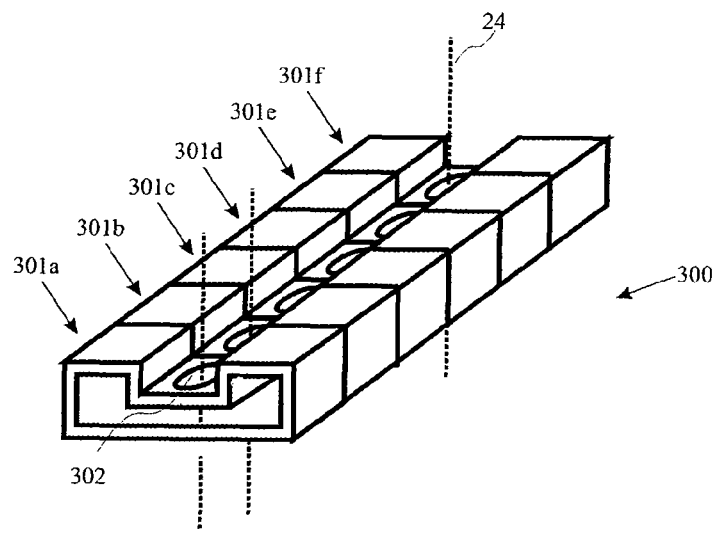
FIGS. 3 to 5 show schematic views of further embodiments of lens arrangements according to the invention.

FIG. 3 additionally differs from FIG. 2 by providing differently shaped openings 302 for the electron beam. Rectangular openings 202 in FIG. 2 are replaced by oval openings 302. As described above, the intention of the present invention is not to have a continuous rotation symmetry that is strongly distorted. Instead, an n-fold symmetry, which is well-defined and is theoretically free of a dipole moment, is aimed for. In this context, theoretically free is to be understood according to the following. The magnetic field is free of a dipole moment besides symmetry-distortions induced by manufacturing intolerances or an approximation at an end of a linear lens array. In general, however, for lens modules having two neighbors, one at each side the dipole moment can be neglected.

The symmetry of the magnetic field interacting with the electron beam depends on the symmetry of the magnetic-conductive circuit, of the excitation and also on the symmetry of opening 302. In view of this influence, opening 302 should be designed to give a well-defined non-continuous rotational symmetry. Within FIGS. 2 to 5, rectangular openings 202, which can optionally have rounded edges, oval openings 302 and 402 oriented along different planes of symmetry or circular openings 502, can for example be provided. The modification of the shape of the openings described above can be combined with other features according to different embodiments presented.

Figure 4:
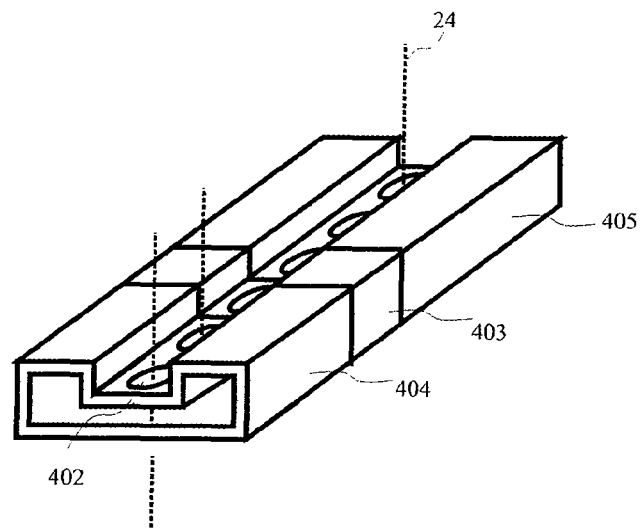
Figure 5:
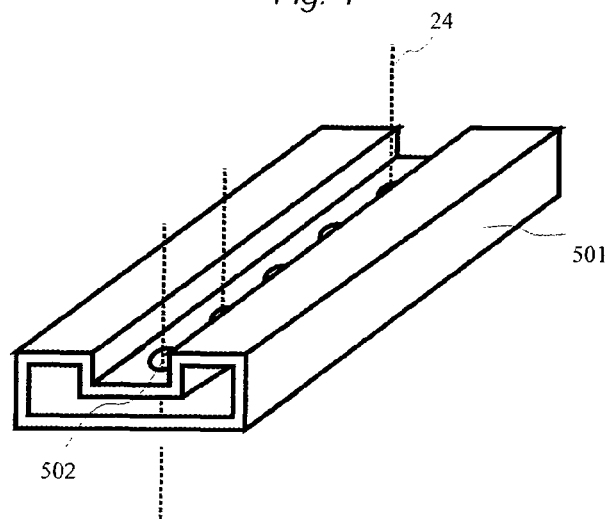

The embodiments shown in FIGS. 4 and 5 additionally differ from FIG. 3 in the number of openings provided per lens module. FIG. 4 shows a lens module 403 for one electron beam, a lens module 404 for two electron beams and a lens module 405 for three electron beams. In general, the different lens modules can be combined. In the case where multi-beam modules are included in the system, it is preferred when there is no gap between the individual modules. Thus, the amount of cross talk to the next lens field is similar for all lens fields. In the embodiment of FIG. 5, a lens module 501 is shown with five round openings 502 for five electron beams traveling along the five optical axes, respectively.

Figure 6A:
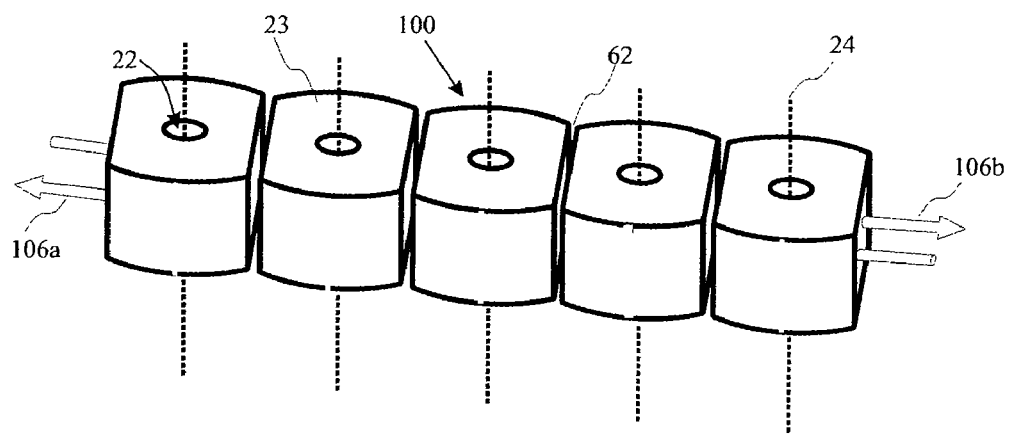
FIGS. 6a to 6b show schematic views of further embodiments according to the invention including possibilities to avoid cross talk.
Figure 6B:
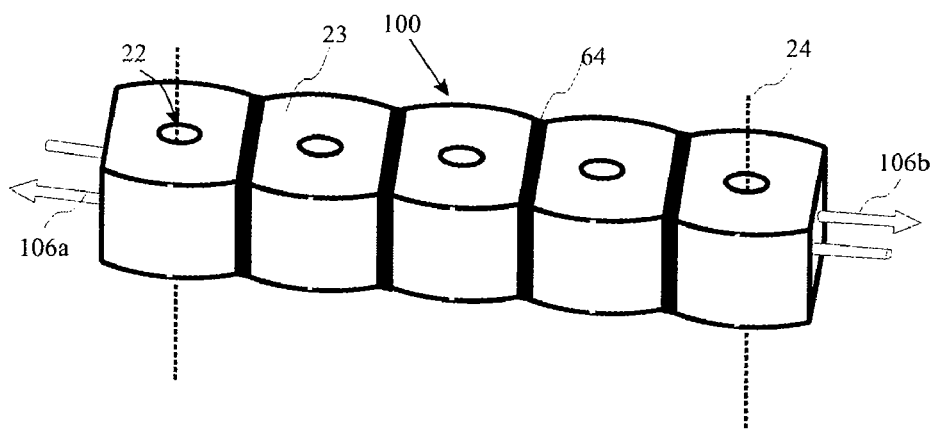

Further embodiments will now be described with respect to FIGS. 6 to 8. FIGS. 6a and 6b show a linear lens array comprising five lens modules. Each lens module has a conductive material circuit 23 in the form of a cylinder with two flattened sides. In the middle of the magnetic material circuit, opening 22 is provided. An electron beam traveling along the optical axis 24 through opening 22 is focused by a magnetic lens field. The magnetic lens field is induced by currents 106a and 106b.

As described above, each individual lens module has two planes of symmetry with respect to optical axis 24. In FIG. 6a, in order to maintain the symmetry of the modules, which might partly be distorted by cross talk, there is a gap 62 in-between each module. Preferably, the gap is between 0.1 mm and 3 mm. Since the magnetic resistance of the magnetic-conductive circuit is several magnitudes lower than the magnetic resistance in the gap, cross talk between neighboring lens modules can be neglected. In an alternative embodiment shown in FIG. 6b, gap 62 is filled with a non-magnetic material. Thus, plate 64 acts as a magnetic isolator between neighboring lens modules. Consequently, the symmetry of each lens module is undisturbed.

Figure 7A:
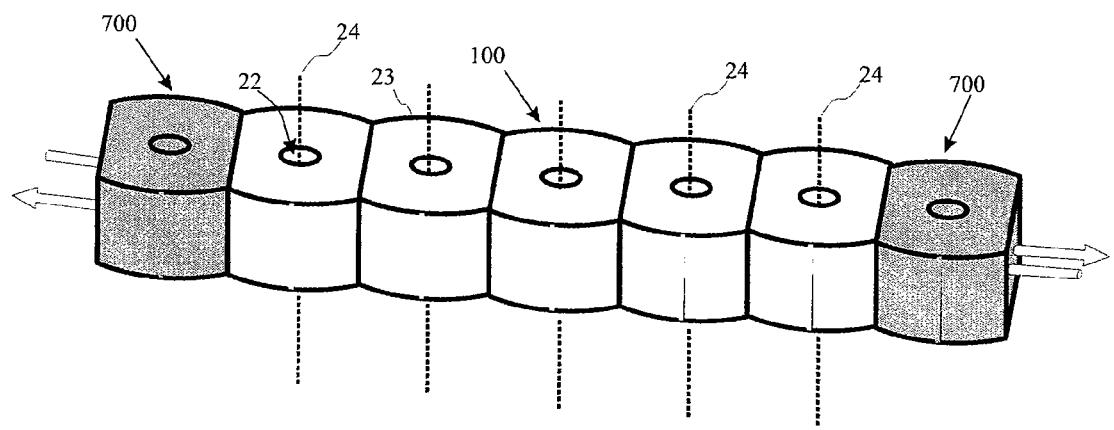
FIGS. 7a to 7b show schematic views of further embodiments according to the invention, including means for providing conditions for a quasi-infinitely long lens row.

A further embodiment of the present invention is shown in FIG. 7a. The lens modules 100 are arranged side by side. The symmetry of each lens module is maintained according to the following arguments. In the case of an infinitely long linear lens array, each lens module 100 would have an identical neighborhood. Thus, each module would have a two-fold symmetrical lens field and no dipole moment. In practice the linear lens array is not infinitely long. Therefore, especially lens modules at the ends of the linear array could have a distorted symmetry. According to FIG. 7a, additional lens modules 700 are provided. These additional modules are not used to focus an electron beam and can be considered a "dummy" module. However, their symmetry is not relevant for the beam forming property of the other lens modules of the linear lens array. As shown in FIG. 7a, five modules, each with one opening for a charged particle beam, are used for focusing. Additionally, two "dummy" modules 700 are provided. Concerning the number of modules and additional lens modules 700, such an embodiment can be considered preferred. However, the present invention should not be limited, thereto. Instead, more than five modules for charged particle beams can be applied and more than one "dummy" modules can be located at each side.

Figure 7B:
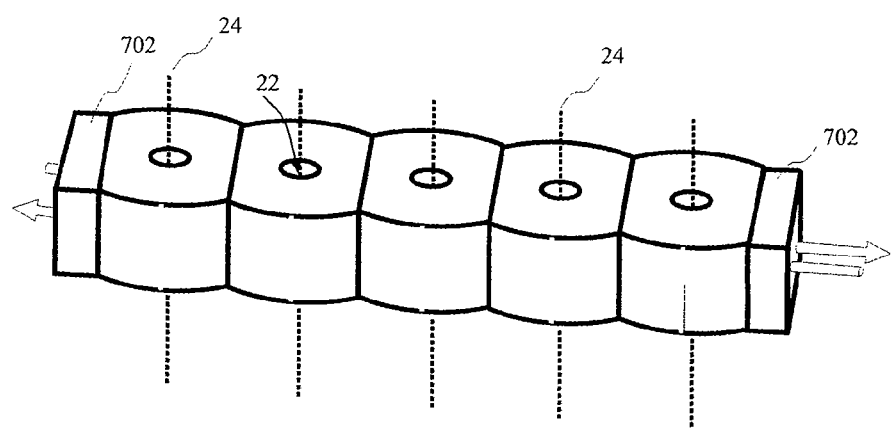

A further embodiment is shown in FIG. 7b. The embodiment comprises shielding plates 702 at both ends of the linear lens array. Specifically, each lens row is terminated at its ends by the shielding plate. These shielding plates can be combined with the "dummy" modules 700 shown in FIG. 7a or can be used independently of the "dummy" modules 700. The shielding plates have two different effects. On the one hand, the influence of the loop of the excitation currents at the end of the linear lens array is shielded. On the other hand, a magnetic neighborhood (periphery) can be provided as if the linear lens array were infinitely long. These two effects can be understood as follows.

The straight conductor for the excitation current cannot be continued arbitrarily for an infinite length. Thus, the conductors have to form a loop at both ends of the linear lens array. In general, the conductors for a linear lens array can be described as a rectangle, whereby the edges of the rectangle are rounded. The conductors comprise several windings to form an excitation coil. The radius of curvature at the rounded edges can be increased until the conductors for the excitation current form a semi-circle at both ends. Thereby, a stadium-like form is realized. This semi-circle disturbs the symmetry of the system. If shielding plate 702 is introduced, the lens modules 100 are not influenced by the semi-circle conductor loop at both ends of the linear lens array.

The other effect of the shielding plates is the following. In the case where the symmetry is based on the fact that every lens module has a similar magnetic surrounding, the end of the linear array distorts the symmetry. Thus, the shielding plate can be used to provide a magnetic surrounding for lens modules located at the end of the linear array as if the linear array would be continued. Consequently, using shielding plates 702, the symmetry distorted by the finite length of the row of openings can at least partly be recovered.

The aspects presented above, namely to provide dummy modules 700 or to provide shielding plates 702, can be used independently for all kinds of lens modules. Thus, the usage of dummy modules 700 or to provide shielding plates 702 within the present invention is not limited to the type of lens modules shown in FIGS. 7a and 7b. It is apparent that these aspects can be combined with all kinds of linear lens arrays.

Figure 8:
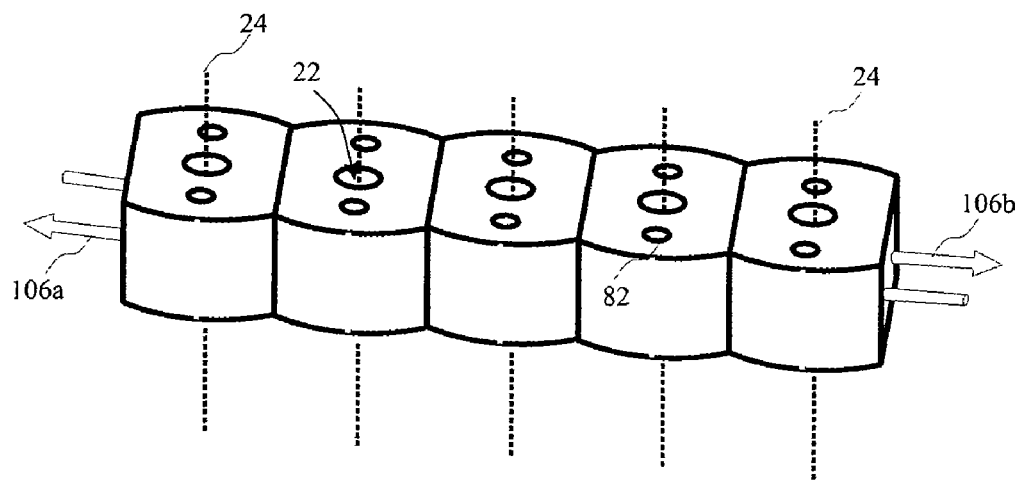
FIG. 8 shows a schematic view of a further embodiment according to the invention, including dummy openings for flux shaping.

In the embodiment shown in FIG. 8, the lens modules 100 are manufactured to shape the magnetic flux provided to opening 22. Therefore, additional holes 82 are provided, whereby the magnetic field provided to opening 22 is modified. Making use of the additional holes 82, it is possible to customize the field focusing the electron beam. In FIG. 8, two openings 82 above and below opening 22 are provided. Thus, the n-fold symmetry with respect to optical axis 24 with n>1 (no dipole moment) is maintained.

In context of this invention, the aspect of providing additional openings 82 can be combined with aspects of other embodiments presented in the application.

Figure 9:
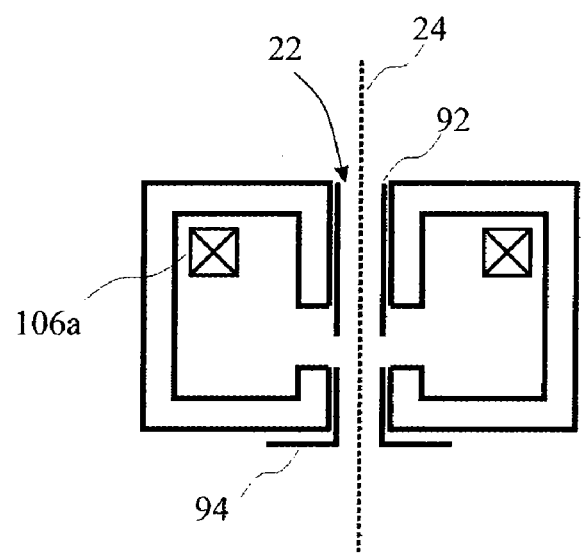
FIG. 9 shows a schematic side view of an embodiment according to the invention, including an electrostatic lens component.

A cross sectional view similar to a view along symmetry plane 104 in FIG. 1a of a further embodiment is shown in FIG. 9. According to this embodiment, an electrostatic lens or electrostatic immersion lens is provided within opening 22. The electrostatic lens comprises two electrodes 92 and 94 arranged symmetrically with respect to optical axis 24. In one example, the two electrodes are used as an electrostatic immersion lens, whereby the imaging properties can be improved. The electrostatic lens within opening 22 according to the embodiment of FIG. 9 can be combined with other aspects of the variety of embodiments presented.

Generally, the embodiments described above refer to the following aspect. At least two lens modules are provided. These lens modules are arranged in the form of a linear lens array, a lens row, and share a single excitation coil. Thereby, a continuous rotational symmetry is deliberately abandoned. Instead, an n-fold rotational symmetry with respect to the optical axis is obtained (n<∞). Since the symmetry obtained has no dipole moment, n is greater than one (1<n<∞). The symmetry can also be described by two planes of symmetry, both intersecting optical axis 24.

The above described symmetry can either be achieved by avoiding cross talk of neighboring lens modules or by providing a quasi infinite linear array lens. Quasi infinite should be understood as either providing a linear array of a sufficient length such that lens modules not located at one of the two ends of the linear array are influenced as if the linear array were infinitely long, or should be understood as providing correction means as shielding plates or "dummy" modules to simulate an infinitely long linear array.

FIG. 10a shows a further embodiment of a lens module 100. The magnetic-conductive circuit 23 has two flattened sides. Due to the flattened sides, two lens modules can be located closer together. For this reason, electron beams traveling through the opening 22 have a smaller distance. The lens module 100 has two planes of symmetry 102 and 104. Thus, a lens field has no dipole moment with respect to opening 22.

Compared to the circular opening 22 in FIG. 10a, the embodiment shown in FIG. 10b has a rectangular opening 22a. This rectangular opening 22a does not generally change the symmetry conditions. However, the lens field influencing an electron beam traveling along the optical axis (center of opening 22a) is modified as compared to the circular opening in FIG. 10a. The choice of the shape of the opening can be used to shape the magnetic flux influencing the electron beam. Thus, the magnetic lens field can be customized.

Both embodiments shown in FIGS. 10 have two planes of symmetry intersecting the optical axis. The form of the magnetic-conductive circuit result in a 2-fold symmetry with respect to the optical axis. In the case where the magnetic-conductive circuit 23 is, according to another embodiment (not shown), a square, a 4-fold symmetry is obtained.

Further embodiments according to the present invention are shown in FIGS. 11a and 11b. The magnetic-conductive circuit 23 shown in FIG. 11a has a hexagonal shape. Opening 22b also has a hexagonal shape, which has the same orientation as the magnetic-conductive circuit 23. Due to the hexagonal shape, three planes of symmetry 102a, 102b and 102c exist. This symmetry can also be described as a 6-fold symmetry with respect to the center of opening 22b. FIG. 11b shows a magnetic-conductive circuit in the shape of an octagon. Octagon-shaped opening 22c is rotated by 22.5° with respect to octagon 23. The 8-fold symmetry of the embodiment of FIG. 11b is unaffected by this rotation of opening 22c. The rotation is another example for a flux shaping technique. The 8-fold symmetry can also be described by the four planes of symmetry 102a to 102d.

Figure 12:
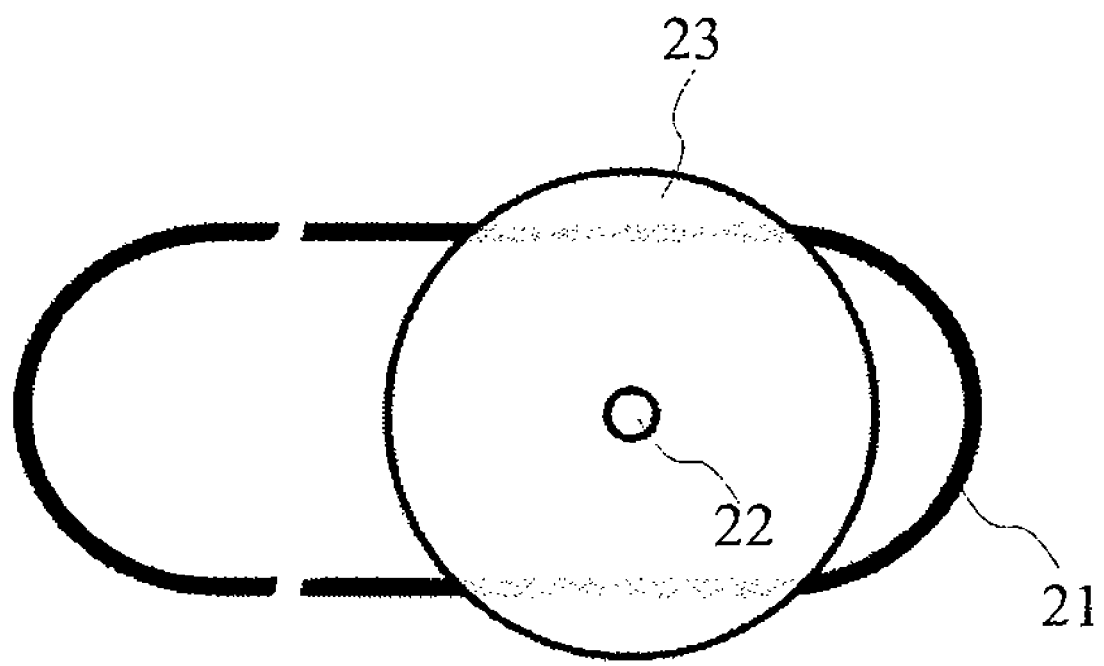
FIG. 12 shows a schematic top view of an embodiment according to the invention, explaining the influence of the excitation on the symmetry.

All embodiments shown in FIGS. 10a to 11b have at least a 2-fold symmetry with respect to the optical axis. The magnetic-conductive circuits and openings described have up to 4 planes of symmetry, each intersecting the center of the respective opening. According to a further embodiment, the increasing number of symmetry planes related to the form of the magnetic-conductive circuits can be decreased by the form of the excitation. FIG. 12 shows an embodiment with a circular magnetic-conductive circuit 23. Coil 21 used for several lens modules has straight conductors, which are in contact with the magnetic-conductive circuit. Thus, the system comprising the lens module and the excitation coil has a 2-fold symmetry. The semi-circle of coil 21 at the two ends is not taken into account, since it can be shielded as described with respect to FIGS. 7a and 7b.

Generally, the embodiments described above have magnetic-conductive circuits 23 with at least two planes of symmetry. Combining these magnetic-conductive circuits with straight conductors, the order of symmetry is reduced to two planes of symmetry. The shape of the magnetic-conductive circuits according to embodiments described above can be combined with other aspects of the variety of embodiments presented within this application.

Figure 13:
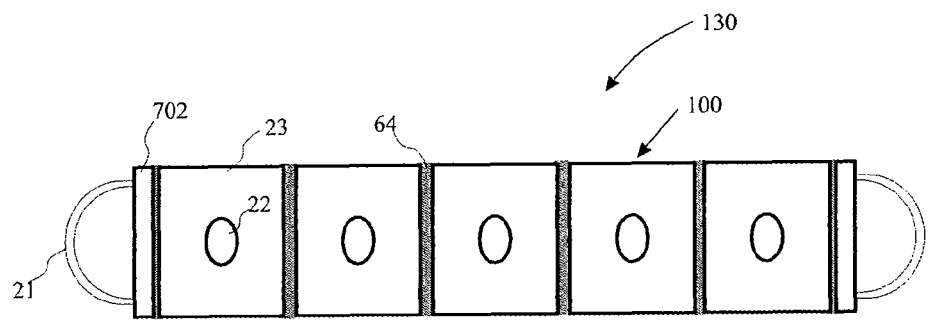
FIGS. 13 to 15 show schematic top views of further embodiments of linear lens arrays and the combination of the linear lens arrays for a two-dimensional lens array.

FIG. 13 shows a linear lens array 130 comprising five lens modules 100. Each lens module comprises a magnetic-conductive circuit 23 forming pole pieces. Within the oval opening 22 in each lens module, a magnetic lens field for focusing an electron beam traveling on the optical axis (=center of opening 22) can be provided.

At both ends of the linear lens array 130, there is a shielding plate 702. Shielding plate 702 shields the excitation current of the semi-circles of coil 21 at both ends. Further, the gap between each lens module is filled with a non-magnetic material forming a magnetic isolator 64. Thus, the lens modules do not influence each other and the 2-fold symmetry of each module is not distorted.

Figure 14:
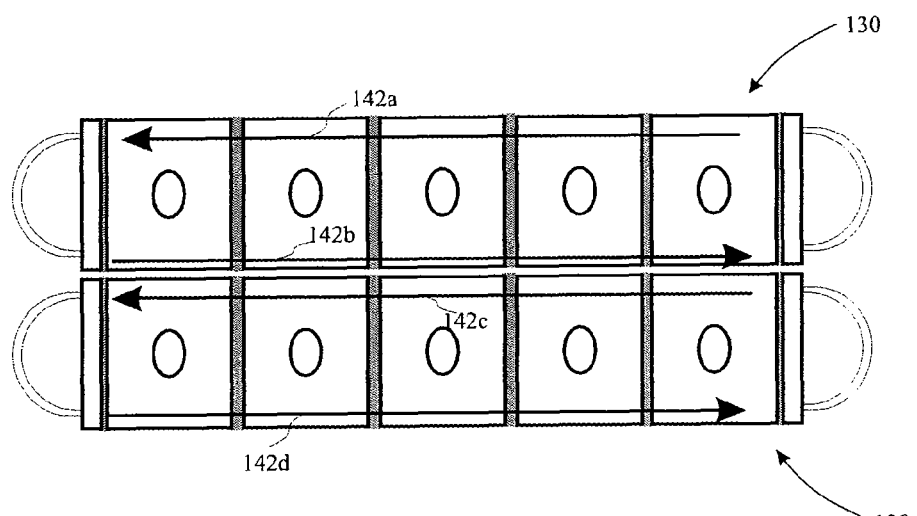

To increase the number of electron beams focused by the lens unit, several linear lens arrays 130 can be arranged next to each other. A respective system is shown in FIG. 14. Thereby, the imaging properties with respect to the symmetry of the lens fields and the manufacturing conditions can be improved. According to an embodiment shown in FIG. 14, the reduced charge particle beam distance of 10 mm to 90 mm can be realized in one direction. In the other direction a charged particle beam distance of 100 mm to 200 mm can be realized.

Within FIG. 14, the currents in coils 21 are indicated by the four arrows 142a to 142d. As can be seen from the figure, the two currents 142b and 142c in the middle of the two linear lens arrays are parallel but directed in the opposite direction. Bringing the two linear lens arrays close together it can be deduced that the total excitation current in the middle of the system is zero, since currents 142b and 142c are canceled out. Thus, it is possible to leave out the two respective regions of coils 21 being directly adjacent. Thus, for the two linear rows of lens modules, a single excitation coil can be used, as shown in FIG. 15.

Thereby, it is preferred to have no magnetic isolating material in between the two rows. As can be seen from FIG. 15, each opening 22 has only one conductor for the excitation current extending within the direct vicinity of the opening. Thus, the symmetry with respect to each opening is disturbed. However, the embodiment shown in FIG. 15 can still be manufactured more easily, since the lens modules are formed of smaller pieces of μ-metal or permalloy as compared to a lens unit having several openings in a single piece. Since these smaller material blocks are easier to provide and easier to process, the embodiment shown in FIG. 15 is still advantageous with respect to prior art systems.

Figure 15:
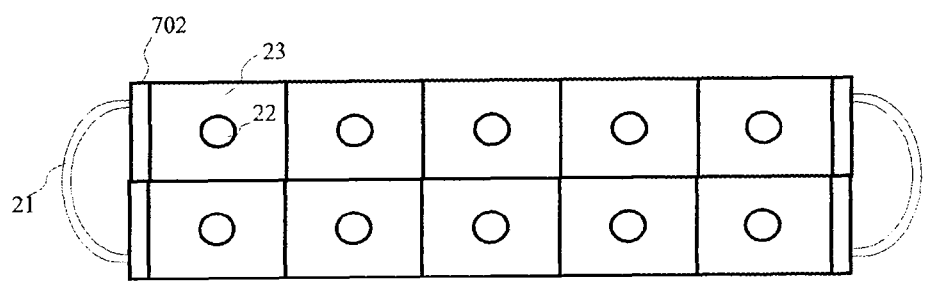

The embodiment shown in FIG. 15 was deduced by leaving out the regions of the coils wherein the currents canceled each other out. The same argument can be applied to combine more than two rows of modules and use a common excitation coil.

Generally, the aspect of forming more than one row of openings by positioning several linear lens arrays next to each other is not limited to the kind of lens module 100 described with respect to FIGS. 13, 14 and 15. The shape of the lens module, the shape of opening 22, the positioning of the lens modules with or without a gap, as well as the existence of a non-magnetic material within a possible gap or the existence of shielding plates 702 can be varied. The aspects of combining several linear lens arrays can be combined with all kinds of linear lens arrays described within this application.

The previous embodiments referred to a magnetic lens comprising at least two lens modules. The lens modules share a common excitation coil. According to the shown embodiments of linear lens arrays, the symmetry of the lens field is at least a 2-fold symmetry with respect to each individual optical axis. This could be achieved by either providing lens modules without any cross talk to neighboring lens modules, lens modules each having similar cross talk compared to the other lens modules, or having a quasi-infinite linear lens array.

The aspect of having at least a 2-fold symmetry with respect to each optical axes can—in the case of a quasi-infinite linear lens array—also be realized independently of the number of modules sharing a common excitation. Thus, it is possible to have a linear lens array providing magnetic fields to each opening for an electron beam that has a symmetry comparable to a infinitely long linear lens array.

Figure 16:
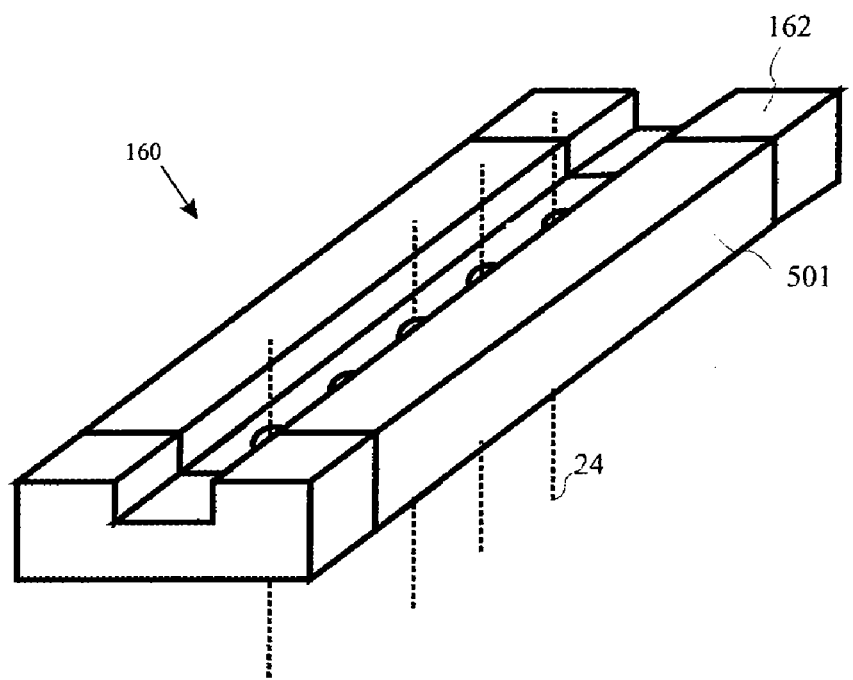
FIGS. 16 to 17 show schematic views of further embodiments according to a further aspect of the invention.

An embodiment according to this aspect is shown in FIG. 16. Therein, the pole piece unit 501 generally contains magnetic flux shaping openings. In one aspect, the pole piece unit 501 has five openings. The center of each opening provides an optical axis for an electron beam. Within the pole piece unit 501, straight conductors are provided as an excitation current. The conductors for the excitation current form a loop within end pieces 162. On the one hand, end pieces 162 shield the pole piece unit from the magnetic field formed by the loops of the excitation current. On the other hand, a magnetic flux can be shaped as if the linear lens array is continued infinitely long, that is to say, a magnetic flux of an quasi-infinitely long linear lens array is shaped.

According to a preferred aspect of the present invention, the length of the pole piece unit can be increased. Thereby, the number of openings can be increased. If a sufficient number of openings is provided, openings adjacent to end piece 162 do not need to be used for focusing an electron beam. These openings can be used as dummy openings. Thus, all openings used for focusing an electron beam are approximately influenced by the same periphery.

Figure 17:
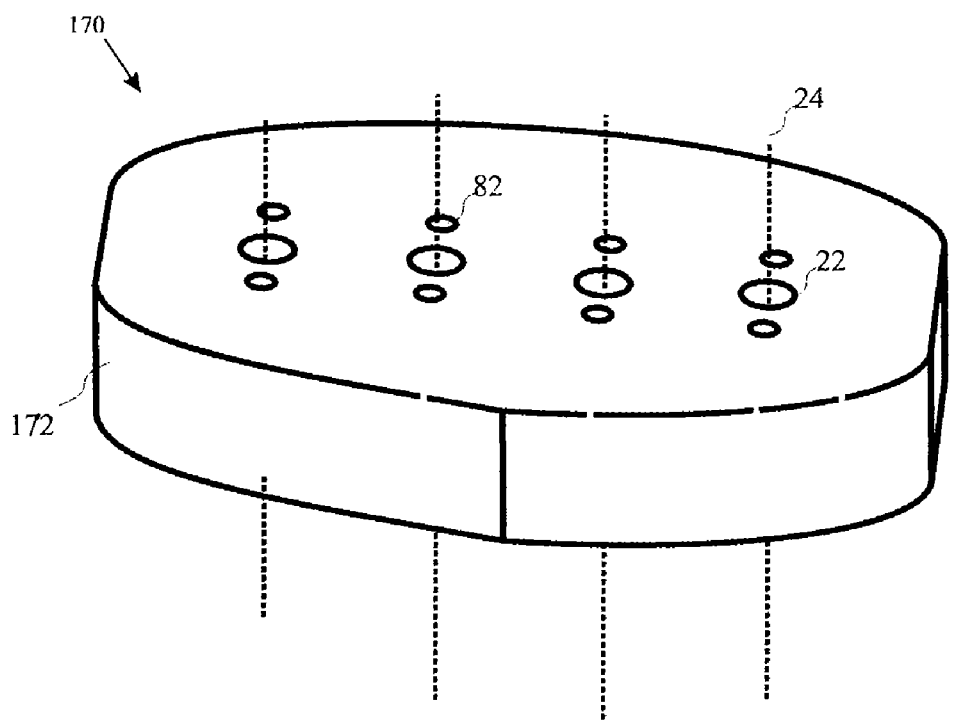

Another embodiment according to this aspect is shown in FIG. 17. Lens system 170 comprises a plurality of openings 22 for focusing electron beams traveling on the optical axes. The openings 22 are provided in a elongated magnetic-conductive circuit 172. The shape of the lens system is oval. The curvature of the oval is chosen such that within each opening a magnetic lens field with at least a 2-fold symmetry is provided. To further shape the magnetic flux, two dummy openings 82 are provided adjacent to each opening 22. Each lens opening 22 and the respective dummy openings are positioned along a line.

In yet another embodiment of the present invention provides a multiple charged particle beam device. The multiple charged particle beam device comprises a charged particle beam source, a detector for detecting secondary particles, a beam shaping means, a housing for the charged particle beam column, whereby the housing can be evacuated, and at least one lens system for a plurality of charged particle beams, the at least one lens system comprising an excitation coil providing a magnetic flux to a pole piece unit having a first pole piece, a second pole piece and at least two openings for charged particle beams, wherein the two openings are arranged in one row, thereby forming a lens row, and wherein the pole piece unit has an elongated shape.

While the foregoing is directed to embodiments of the present invention other and further embodiments of the invention may be devised without departing from the basic scope thereof and the scope thereof is determined by the claims that follow.

The invention claimed is:

1. A lens system for a plurality of charged particle beams, comprising:
   an excitation coil providing a magnetic flux to a pole piece unit having a first pole piece, a second pole piece and at least two openings for charged particle beams,
   wherein the at least two openings are arranged in one lens row, and wherein the pole piece unit has an elongated shape in the direction of the lens row such that within each opening a magnetic lens field with a 2-fold symmetry is provided.

2. The lens system according to claim 1, wherein the excitation coil has a non-circular shape.

3. The lens system according to claim 1, wherein the excitation coil has a rectangular shape with rounded edges.

4. The lens system according to claim 3, wherein the edges are rounded such that the sides of the rectangular shape form a semi-circle.

5. The lens system according to claim 1, wherein at least four openings are provided within the one lens row.

6. The lens system according to claim 1, wherein one charged particle beam travels through each of the openings.

7. The lens system according to claim 1, wherein the elongated shape of the pole piece unit provides the magnetic lens field with the 2-fold symmetry and the pole piece unit provides a 2-fold symmetry of the magnetic lens field within each opening.

8. The lens system according to claim 1, wherein at least two lens rows, each comprising an excitation coil, are arranged next to each other to form a two-dimensional arrangement of openings.

9. The lens system according to claim 1, wherein the openings for the charged particle beams have at least in one direction a distance with respect to each other of about 10 mm to 90 mm.

10. The lens system according to claim 1, wherein each lens row is terminated at its ends by a shielding plate.

11. The lens system according to claim 1, wherein the pole piece unit comprises magnetic flux shaping openings.

12. The lens system according to claim 1, wherein for each opening, an electrostatic immersion lens is provided.

13. The lens system according to claim 12, wherein each electrostatic immersion lens comprises at least two electrodes.

14. A multiple charged particle beam device, comprising:
   a charged particle beam source;
   a detector for detecting secondary particles;
   a beam shaping means;
   a housing for the charged particle beam column, whereby the housing can be evacuated; and
   at least one lens system for a plurality of charged particle beams, the at least one lens system comprising:
      an excitation coil providing a magnetic flux to a pole piece unit having a first pole piece, a second pole piece and at least two openings for charged particle beams,
      wherein the at least two openings are arranged in one lens row, and wherein the pole piece unit has an elongated shape in the direction of the lens row such that within each opening a magnetic lens field with a 2-fold symmetry is provided.

15. The multiple charged particle beam device according to claim 14, wherein the excitation coil has a non-circular shape or wherein the excitation coil has a rectangular shape with rounded edges.

16. The multiple charged particle beam device according to claim 14, wherein at least four openings are provided within the one lens row.

17. The multiple charged particle beam device according to claim 14, wherein one charged particle beam travels through each of the openings.

18. The multiple charged particle beam device according to claim 14, wherein the elongated stage at the pole piece unit provides the magnetic lens field with the 2-fold symmetry and the pole piece unit provides a 2-fold symmetry of the magnetic lens filed within each opening.

19. The multiple charged particle beam device according to claim 14, wherein at least two lens rows, each comprising an excitation coil, are arranged next to each other to form a two-dimensional arrangement of openings.

20. The multiple charged particle beam device according to claim 14, wherein the openings for the charged particle beams have at least in one direction a distance with respect to each other of about 10 mm to 90 mm.

* * * * *